United States Patent [19]

Wu

[11] 4,456,489
[45] Jun. 26, 1984

[54] METHOD OF FORMING A SHALLOW AND HIGH CONDUCTIVITY BORON DOPED LAYER IN SILICON

[75] Inventor: Schyi-Yi Wu, Mesa, Ariz.
[73] Assignee: Motorola, Inc., Schaumburg, Ill.
[21] Appl. No.: 434,677
[22] Filed: Oct. 15, 1982
[51] Int. Cl.³ .......................................... H01L 21/265
[52] U.S. Cl. .................................. 148/1.5; 29/576 B; 148/187; 357/2; 357/91
[58] Field of Search ............... 148/1.5, 187; 29/576 B; 357/2, 91

[56] References Cited

U.S. PATENT DOCUMENTS

| 3,589,949 | 6/1971 | Nelson | 148/186 |
|---|---|---|---|
| 4,133,704 | 1/1979 | Greenstein et al. | 148/1.5 |
| 4,144,100 | 3/1979 | McIver et al. | 148/1.5 |
| 4,216,030 | 8/1980 | Graul et al. | 148/1.5 |
| 4,240,096 | 12/1980 | Hiraki et al. | 357/63 |
| 4,391,651 | 7/1983 | Yoder | 148/1.5 |

OTHER PUBLICATIONS

Blood et al., Jour. Appl. Phys. 50 (1979) 173.
Kerkov et al., Phys. Stat. Solidi, 70a (Apr. 1982) 489.
Ryssel et al. in Ion Implantation in S/C-, Ed. B. Crowder, Plenum, N.Y. 1973, p. 215.
Suni et al., Thin Solid Films, 93 (Jul. 1982) 171.
Tsai et al., Jour. Appl. Phys. 50 (1979) 188.
Crowder, J. Electrochem. Soc. 117 (1970) 671.

Primary Examiner—Upendra Roy
Attorney, Agent, or Firm—John A. Fisher

[57] ABSTRACT

Implanting, with low energy (e.g. 75 Kev and below), a dose of boron difluoride ($BF_2$) into an area on a silicon substrate which is post-damaged or pre-damaged by a silicon implant so that annealing, or activation, can be accomplished at temperatures in the range of 550° C. to 900° C.

11 Claims, 2 Drawing Figures

METHOD OF FORMING A SHALLOW AND HIGH CONDUCTIVITY BORON DOPED LAYER IN SILICON

BACKGROUND OF THE INVENTION

The trend toward smaller geometry devices in the fabrication of very large scale or very high speed integrated circuits necessitates the use of shallower junctions. For example, in MOS transistors a reduction in source and drain junction depth by a factor of 8 is required to shrink the gate length by a factor of 2 at a given gate oxide thickness and a given substrate doping level.

In the formation of doped layers, which are utilized to form junctions, a common method utilized is to implant a dose of the dopant material into the substrate and then anneal the substrate to activate the doped layer. Implanting is performed by stripping electrons from molecules of the doping material to form ions and accelerating the ions at the substrate by way of a high energy ion beam. As the ions strike the substrate, atoms of the substrate material are moved out of the crystal lattice, or formation. Generally, it is desirable to disturb the position of enough of the substrate atoms in the region to be doped so that an amorphous layer is formed.

Once the dopant material is implanted in the substrate, the substrate is heated (annealed) to a temperature sufficient to reform the material into a crystalline structure with the ions of the doping material occupying the crystal lattice at regular intervals. Each ion of the doping material which is properly positioned in the crystal lattice is referred to as activated. When all of the atoms of the original substrate material are reformed into a crystal lattice and all, or substantially all, of the ions of the doping material are properly positioned in the lattice the doped layer is completely activated. Generally, the amount of activation depends upon the temperature utilized in the annealing process and the length of time the substrate is annealed. The amount of activation is measured by measuring the sheet resistivity of the implanted layer; maximum or nearly maximum activation is signaled by a decrease and then leveling of resistivity as a function of annealing temperature or annealing time at a given temperature. If the doped layer in the substrate is not rendered completely amorphous by the ion implantation, that is some of the atoms of the substrate are still in a partial crystal lattice, the lattice must be broken down and reformed during the annealing process and, in such case, higher temperatures are required for adequate activation. However, because of the smaller geometry devices and the need to reduce processing costs, it is desirable to reduce the annealing temperatures as much as possible.

SUMMARY OF THE INVENTION

The present invention pertains to a method of forming a relatively high conductivity boron doped layer less than approximately 0.3 microns thick in a silicon substrate by implanting in the substrate, with an energy less than approximately 75 Kev, a dose of boron difluoride in the range of approximately $6 \times 10^{14}/cm^2$ to $5 \times 10^{15}/cm^2$, post-damaging or pre-damaging the implanted area of the substrate with an implant such that the damage is approximately equivalent to the damage produced by a $1 \times 10^{15}/cm^2$ dose of silicon implanted at an energy of approximately 100 Kev; and annealing the substrate at a temperature in the range of approximately 675° C. to 990° C. When the implanted area is post-damaged, i.e. after the boron difluoride implant, the range of annealing temperatures can be extended to as low as 550° C.

It is an object of the present invention to provide a new and improved method of forming a relatively high conductivity, shallow boron doped layer in a silicon substrate.

It is a further object of the present invention to provide a new and improved method of forming a relatively high conductivity, shallow boron doped layer requiring relatively low annealing, or activation, temperatures.

It is a further object of the present invention to provide a new and improved method of forming a relatively high conductivity, shallow boron doped layer wherein boron difluoride is used for doping at a relatively low energy.

These and other objects of this invention will become apparent to those skilled in the art upon consideration of the accompanying specification, claims and drawing.

DESCRIPTION OF THE PREFERRED EMBODIMENTS

In the novel methods embodying the present invention, boron difluoride ($BF_2$) in the form of singly ionized boron difluoride molecules ($BF_2^+$) is used as the dopant to produce a relatively high conductivity boron doped layer less than approximately 0.3 microns thick in a silicon substrate. A boron difluoride implant is used to produce P-type shallow layers in a silicon substrate for two reasons. One, by using boron difluoride the shallow boron implant distribution, which depends on the mass ratio of boron to boron difluoride ($11/49 = 0.224$), can be produced at a reasonably high accelerator voltage with a stable ion beam. Two, higher throughput and greater savings in capital investment can be realized due to the higher beam current achievable with boron difluoride compared to boron, i.e. greater than 5:1.

It is known by those skilled in the art that the critical dose for the formation of an amorphous layer in a silicon substrate is below $1 \times 10^{15}/cm^2$ for a 150 Kev boron difluoride implant. This critical dose is the implant dose above which an amorphous layer is formed. It is also known by those skilled in the art that the $1 \times 10^{15}/cm^2$ dose of boron difluoride implanted at 150 Kev can be activated to the maximum level at temperatures greater than or equal to 650° C., resulting in a doped layer greater than 0.3 microns thick. For small geometry devices, however, such as submicron MOS transistors, boron doped layers shallower than 0.3 microns are required. To produce the shallower layers lower energy implants and/or lower activation temperatures are needed. To achieve a final implant depth of less than 0.3 microns the implant energy, using boron difluoride as the dopant, must be limited to less than about 75 Kev. Since the critical dose of dopant required for the formation of an amorphous layer is normally reduced as the implant energy is reduced, one skilled in the art would expect that a lower energy boron difluoride implant could also be activated to the maximum level with a temperature greater than or equal to 650° C.

Figure 1:
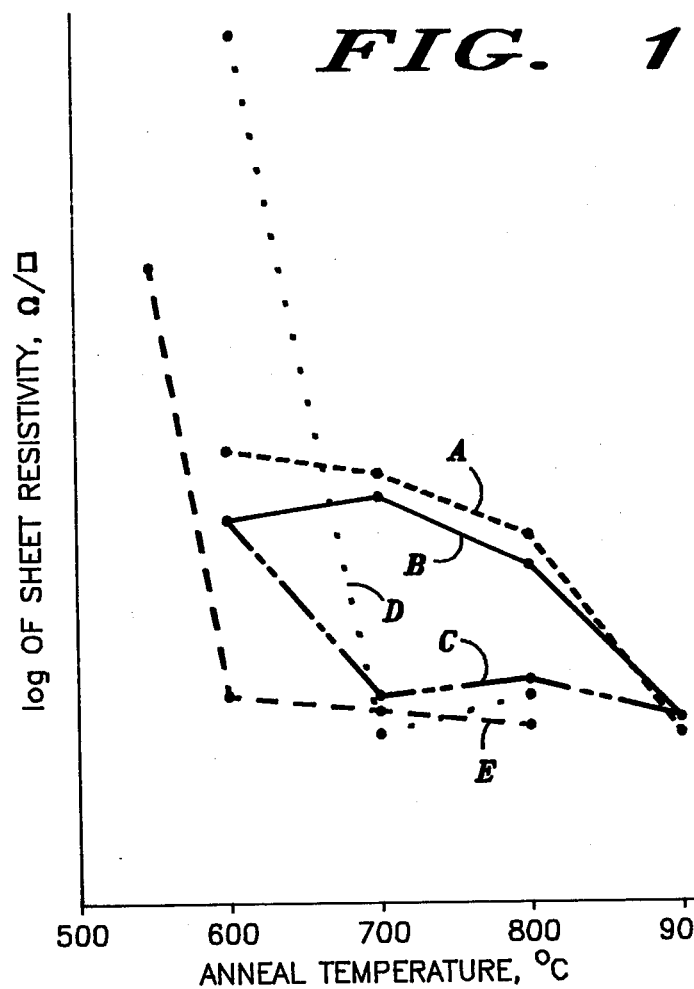
FIG. 1 is a graph of the sheet resistance of the doped layer versus the annealing temperature for five different methods of producing the doped layer using 40 Kev implant energy.
Figure 2:
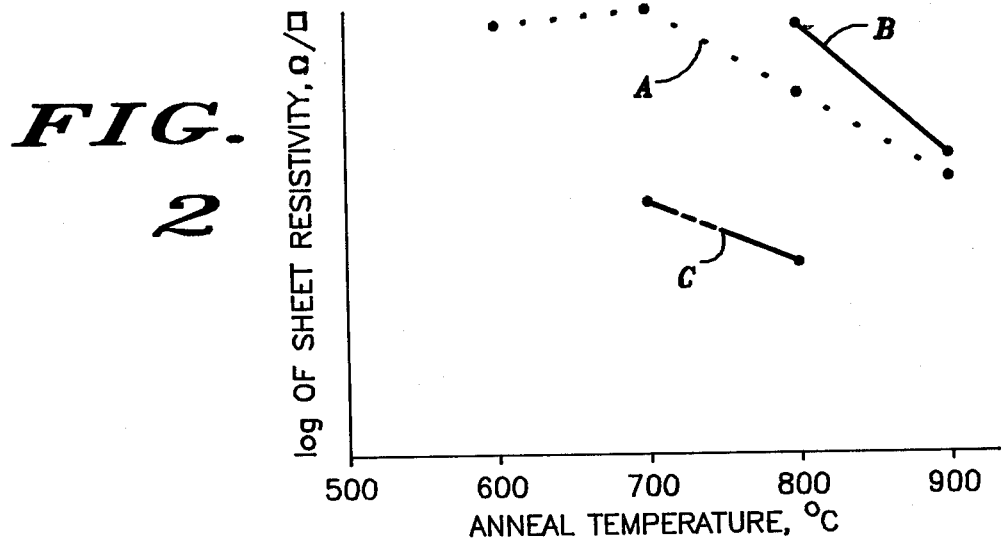
FIG. 2 is a graph similar to FIG. 1 using 28 Kev implant energy.

Unexpectedly, it was found through experimentation that $1\times10^{15}/cm^2$ doses of boron difluoride implanted at 28 Kev and 40 Kev were not activated to the maximum level at less than or equal to 800° C. Curve A of FIG. 1 illustrates the sheet resistance versus the anneal temperature for a $2\times10^{15}/cm^2$ dose of boron difluoride implanted at 40 Kev. Curve A of FIG. 2 illustrates the sheet resistance versus the anneal temperature for a $1\times10^{15}/cm^2$ dose of boron difluoride implanted at 28 Kev. For each implant the sheet resistivity is about 290 ohms per $cm^2$ at 800° C. annealing temperature. This value is greater than those obtained for the 900° C. anneal indicating activation is not maximized at 800° C.

Since increased activation reduces the sheet resistance, from these graphs it can be seen that decreasing the implant energy from 150 Kev to 28 Kev or 40 Kev decreased the amount of activation at a specific annealing temperature. One skilled in the art would then expect that too much damage is created at the reduced implant energy levels to achieve the maximum activation. Thus, if additional damage, greater than that created by the boron difluoride implant alone, were produced by additional processing of the substrate, the activation would be adversely effected. This assumption was confirmed by implanting a $1\times10^{15}/cm^2$ dose of boron difluoride at 28 Kev into a silicon layer, which was pre-damaged by a $1\times10^{15}/cm^2$ dose of silicon implanted at 100 Kev, and annealing at 800° C. and 900° C. as indicated by curve B of FIG. 2. A comparison of curves B and A of FIG. 2 quickly illustrates that the additional damage caused by the pre-damaged implant reduced the amount of activation, e.g. 350 ohms per $cm^2$ versus 290 ohms per $cm^2$ for the 800° C., 10 minute anneal. Unexpectedly a $2\times10^{15}/cm^2$ dose of boron difluoride implanted at a 40 Kev energy into a substrate pre-damaged by a $1\times10^{15}/cm^2$ dose of silicon implanted at 100 Kev (curve B of FIG. 1) gave better activation than the boron difluoride implanted into an undamaged substrate (curve A of FIG. 1). However, maximum activation was not achieved. In both of the pre-damaged experiments (curves B of FIGS. 1 and 2) the silicon implant was performed at room temperature.

In a second procedure a pre-damaged layer was created in a silicon substrate by implanting a $1\times10^{15}/cm^2$ dose of silicon at an energy of 100 Kev and at the temperature of liquid nitrogen. A $2\times10^{15}/cm^2$ dose of boron difluoride was then implanted at 40 Kev at room temperature and samples were annealed at 600° C., 700° C., 800° C. and 900° C. The results of this procedure are depicted by curve C of FIG. 1. From a comparison of curve C with curves A and B of FIG. 1 it can be seen that the activation was further improved, particularly for anneals at 700° C. and 800° C. In this procedure the activation was improved by more damage since the silicon implant at liquid nitrogen temperature causes more damage than the silicon implant at room temperature (curve B of FIG. 1).

It is known to those skilled in the art that a damaging implant subsequent to the main doping implant (post-damage) creates more damage than the pre-damaged implants discussed above. Thus, one skilled in the art would expect: (1) better or at least equal activation if the damaging implant at liquid nitrogen temperature is performed after the boron difluoride implant; and (2) better activation by the post-damage at liquid nitrogen temperature than at room temperature. In a third procedure a substrate having a $2\times10^{15}/cm^2$ dose of boron difluoride implanted at 40 Kev was post-damaged by a $1\times10^{15}/cm^2$ dose of silicon implanted at 100 Kev at liquid nitrogen temperature and annealed at 600° C., 700° C. and 800° C. Curve D of FIG. 1 illustrates the results of this procedure. For anneals at 700° C. and 800° C. better activation was achieved by the post-damage at liquid nitrogen temperature than by pre-damage at liquid nitrogen temperature (curve C of FIG. 1). However, the post-damage at liquid nitrogen temperature gave substantially worse activation than the pre-damage at liquid nitrogen temperature for anneals of 600° C.

In a still further procedure, a substrate having a $2\times10^{15}/cm^2$ dose of boron difluoride implanted at 40 Kev was post-damaged by a $1\times10^{15}/cm^2$ dose of silicon implanted at 100 Kev, both implants at room temperature. This post-damaged substrate was annealed at 550° C., 600° C., 700° C. and 800° C., the results being illustrated by curve E of FIG. 1. Unexpectedly, the post-damage at room temperature gave better activation than the post-damage at liquid nitrogen temperature for anneals at 550° C. and 600° C. For the anneal at 550° C. the room temperature post-damaged sample gave 640 ohms per $cm^2$ after a 10 minute anneal and 197 ohms per $cm^2$ after a 1 hour anneal. For the anneal at 600° C. the sample pre-damaged at liquid nitrogen temperature gave 300 ohms per $cm^2$ after a 10 minute anneal and 187 ohms per $cm^2$ after a 30 minute anneal.

The as implanted boron profile is essentially preserved for all of the room temperature post-damaged samples for all of the anneals reported here (550° C., 600° C., 700° C. and 800° C. for 10 minutes, and 550° C. for 1 hour). The sheet resistance values indicate that maximum activation was realized by post-damage at room temperature for anneals at 550° C. to 800° C., by pre-damage at liquid nitrogen temperature for anneals at 600° C. to 800° C., and by post-damage at liquid nitrogen temperature for anneals at 700° C. and 800° C. In a final procedure, a substrate having a $2\times10^{15}/cm^2$ dose of boron difluoride implanted at 28 Kev was post-damaged with a $1\times10^{15}/cm^2$ dose of silicon implanted at 100 Kev. These substrates were annealed at 700° C. and 800° C. for 10 minutes. These post-damaged substrates also gave nearly maximum activation, as illustrated by curve C of FIG. 2.

Thus, a method of forming a relatively high conductivity boron doped layer less than approximately 0.3 microns thick in a silicon substrate is disclosed. While all of the damaging implants utilized herein were silicon, it will be understood by those of skill in the art that other types of implant, such as neon and argon might be utilized. Further, any low energy, 75 Kev and below, implants of boron difluoride will provide the desired shallow boron doped layers with high electrical activity. Also, while doses of $1\times10^{15}/cm^2$ and $2\times10^{15}/cm^2$ were utilized herein, doses in the range of approximately $6\times10^{14}/cm^2$ to $5\times10^{15}/cm^2$ will provide sufficiently shallow layers. Similarly, although the damaging implant disclosed herein is a $1\times10^{15}/cm^2$ dose of silicon implanted at an energy of approximately 100 Kev, it will be understood that alterations or adjustments in the size of the dose and amount of energy would be well within the purview of those skilled in the art and all such alterations and changes are considered to be within the teachings herein if the damage is approximately equivalent.

While I have shown and described specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

I claim:

1. A method of forming a relatively high conductivity boron doped layer less than approximately 0.3 microns thick in a silicon substrate comprising the steps of:
    implanting in the substrate with an energy less than approximately 75 Kev a dose of boron difluoride in the range of approximately $6 \times 10^{14}$/cm$^2$ to $5 \times 10^{15}$/cm$^2$;
    damaging the implanted area of the substrate with an implant an amount approximately equivalent to the damage produced by a dose of silicon approximately $1 \times 10^{15}$/cm$^2$ implanted at an energy of approximately 100 Kev; and
    annealing the substrate at a temperature in the range of approximately 675° C. to 900° C.

2. A method as claimed in claim 1 wherein the damaging implant is performed at approximately room temperature.

3. A method as claimed in claim 1 wherein the damaging implant is performed at approximately liquid nitrogen temperature.

4. A method as claimed in claim 1 wherein the boron difluoride implant is a dose of approximately $2 \times 10^{15}$/cm$^2$ implanted at an energy of approximately 40 Kev.

5. A method as claimed in claim 1 wherein the annealing is performed for at least approximately 10 minutes.

6. A method as claimed in claim 1 wherein the damaging implant is chosen from the group consisting of silicon, argon and neon.

7. A method as claimed in claim 6 wherein the damaging implant is silicon.

8. A method as claimed in claim 1 wherein an energy of approximately 40 Kev is used to implant the dose of boron difluoride.

9. A method of forming a relatively high conductivity boron doped layer less than approximately 0.3 microns thick in a silicon substrate comprising the steps of:
    implanting in the substrate with an energy less than approximately 75 Kev a dose of boron difluoride in the range of approximately $6 \times 10^{14}$/cm$^2$ to $5 \times 10^{15}$/cm$^2$; and then
    damaging the implanted area of the substrate with an implant an amount approximately equivalent to the damage produced by a dose of silicon approximately $1 \times 10^{15}$/cm$^2$ implanted at an energy of approximately 100 Kev at approximately room temperature; and then
    annealing the substrate at a temperature in the range of approximately 550° C. to 900° C.

10. A method of forming a relatively high conductivity boron doped layer less than approximately 0.3 microns thick in a silicon substrate comprising the steps of:
    implanting in the substrate with an energy less than approximately 75 Kev a dose of boron difluoride in the range of approximately $6 \times 10^{14}$/cm$^2$ to $5 \times 10^{15}$/cm$^2$; and then
    damaging the implanted area of the substrate with an implant an amount approximately equivalent to the damage produced by a dose of silicon approximately $1 \times 10^{15}$/cm$^2$ implanted at an energy of approximately 100 Kev at a temperature of approximately liquid nitrogen; and then
    annealing the substrate at a temperature in the range of approximately 675° C. to 900° C.

11. A method of forming a relatively high conductivity boron doped layer less than approximately 0.3 microns thick in a silicon substrate comprising the steps of:
    damaging an area in the substrate with an implant an amount approximately equivalent to the damage produced by a dose of silicon approximately $1 \times 10^{15}$/cm$^2$ implanted at an energy of approximately 100 Kev at a temperature of approximately liquid nitrogen; and then
    implanting in the damaged area with an energy less than approximately 75 Kev a dose of boron difluoride in the range of approximately $6 \times 10^{14}$/cm$^2$ to $5 \times 10^{15}$/cm$^2$; and then
    annealing the substrate at a temperature in the range of approximately 600° C. to 900° C.

* * * * *